US009387691B2

(12) United States Patent
Conley et al.

(10) Patent No.: US 9,387,691 B2
(45) Date of Patent: Jul. 12, 2016

(54) METHOD AND APPARATUS FOR LASER MARKING AN OBJECT

(71) Applicant: FIRST SOLAR, INC., Perrysburg, OH (US)

(72) Inventors: Joshua Conley, Sylvania, OH (US); James Ernest Hinkle, Lambertville, MI (US)

(73) Assignee: First Solar, Inc., Perrysburg, OH (US)

( * ) Notice: Subject to any disclaimer, the term of this patent is extended or adjusted under 35 U.S.C. 154(b) by 555 days.

(21) Appl. No.: 13/720,179

(22) Filed: Dec. 19, 2012

(65) Prior Publication Data

US 2013/0155168 A1    Jun. 20, 2013

Related U.S. Application Data

(60) Provisional application No. 61/577,947, filed on Dec. 20, 2011.

(51) Int. Cl.
| | | |
|---|---|---|
| *B41J 2/435* | (2006.01) | |
| *B41J 3/407* | (2006.01) | |
| *H01L 21/67* | (2006.01) | |
| *B41J 2/44* | (2006.01) | |

(52) U.S. Cl.
CPC ............... *B41J 3/4073* (2013.01); *B41J 2/435* (2013.01); *B41J 2/442* (2013.01); *H01L 21/67282* (2013.01)

(58) Field of Classification Search
CPC .............. B41J 2/442; B41J 2/447; B41J 3/28; B41J 3/4073
See application file for complete search history.

(56) References Cited

U.S. PATENT DOCUMENTS

| | | | |
|---|---|---|---|
| 4,024,545 A * | 5/1977 | Dowling et al. | 347/259 |
| 4,993,042 A | 2/1991 | Mehmke et al. | |
| 5,526,373 A | 6/1996 | Karpinski | |
| 5,550,574 A * | 8/1996 | Dillow | 347/262 |
| 5,584,458 A | 12/1996 | Rando | |
| 6,359,253 B1 | 3/2002 | Sritulanont et al. | |
| 6,362,451 B1 * | 3/2002 | Karni et al. | 219/121.68 |
| 7,622,806 B2 | 11/2009 | Su et al. | |
| 2004/0166444 A1 | 8/2004 | Kiso | |
| 2004/0182933 A1 | 9/2004 | Tien | |
| 2008/0017620 A1 * | 1/2008 | Sukhman et al. | 219/121.86 |
| 2008/0156777 A1 | 7/2008 | Gattiglio et al. | |
| 2008/0223834 A1 * | 9/2008 | Griffiths et al. | 219/121.69 |
| 2008/0231657 A1 | 9/2008 | Marsh et al. | |
| 2008/0278565 A1 | 11/2008 | Marsh et al. | |
| 2009/0224643 A1 * | 9/2009 | Kouchi | 312/334.44 |
| 2011/0008947 A1 * | 1/2011 | Cunningham et al. | 438/463 |
| 2011/0132884 A1 * | 6/2011 | Manens et al. | 219/121.72 |
| 2011/0284511 A1 * | 11/2011 | Boynton et al. | 219/121.72 |
| 2012/0181259 A1 * | 7/2012 | Kwong et al. | 219/201 |

FOREIGN PATENT DOCUMENTS

| | | |
|---|---|---|
| DE | 10 2008 000 215 A1 | 8/2009 |
| EP | 1 705 600 A2 | 9/2006 |
| EP | 2 078 586 A1 | 7/2009 |

OTHER PUBLICATIONS

International Search Report dated Mar. 25, 2013.

* cited by examiner

*Primary Examiner* — Kristal Feggins
*Assistant Examiner* — Kendrick Liu
(74) *Attorney, Agent, or Firm* — Blank Rome LLP

(57) ABSTRACT

Disclosed embodiments provide laser object marking methods and devices in which multiple slidable mechanisms are used for holding respective laser heads.

19 Claims, 14 Drawing Sheets

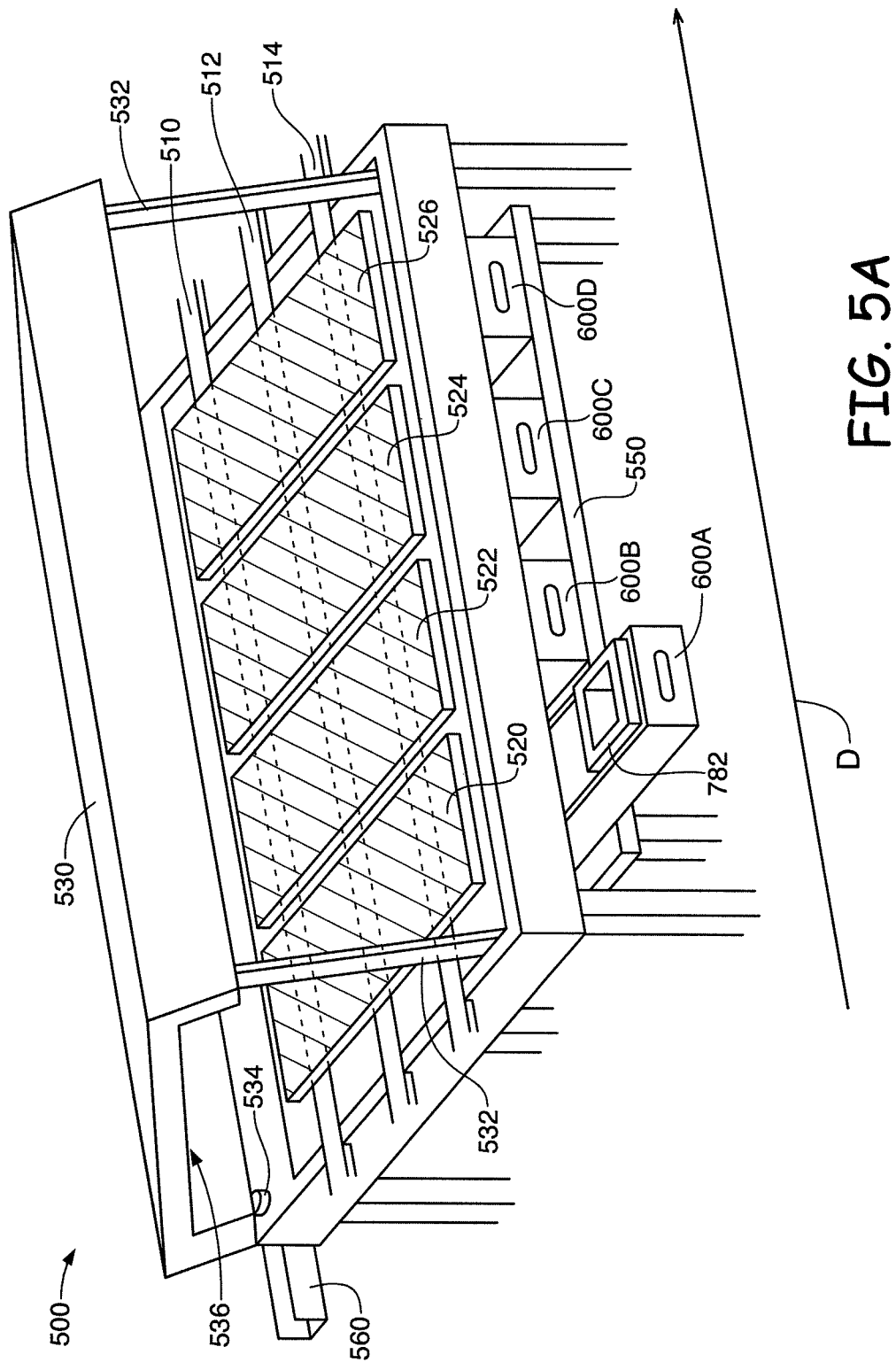

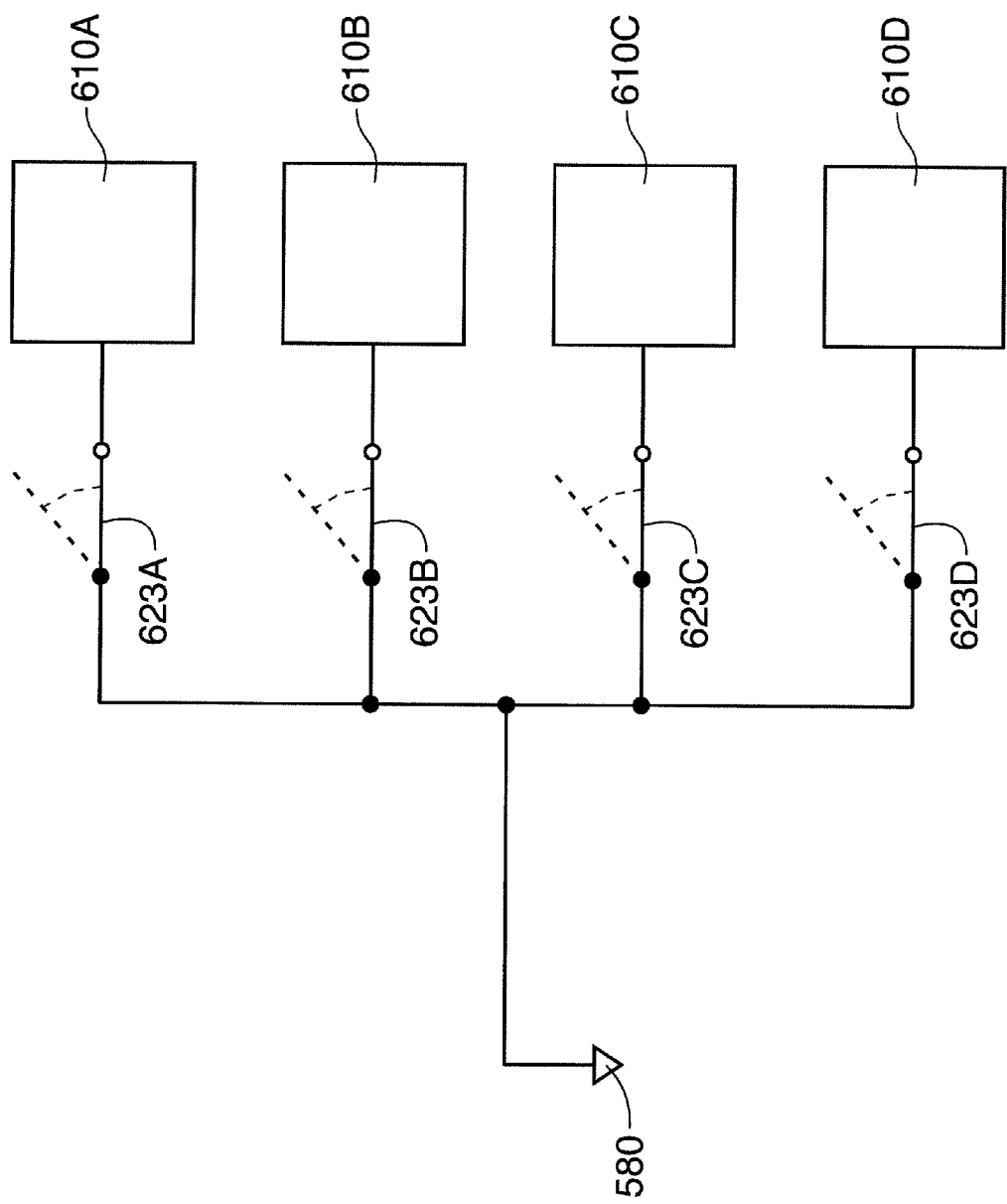

METHOD AND APPARATUS FOR LASER MARKING AN OBJECT

CROSS-REFERENCE TO RELATED APPLICATION

This application claims priority to U.S. Provisional Application No. 61/577,947, filed Dec. 20, 2011, which is hereby fully incorporated by reference.

FIELD OF TECHNOLOGY

The present invention relates to methods and apparatuses for marking an object in a manufacturing process, for example, in a photovoltaic module manufacturing process.

BACKGROUND

Photovoltaic (PV) modules are becoming increasingly popular for providing renewable energy. FIGS. 1 and 2 show a top perspective view and a bottom perspective view, respectively, of a conventional photovoltaic module 10. The module 10 may use any photovoltaic technology, including thin film technologies that use cadmium telluride (CdTe) or copper indium gallium diselenide (CIGS) as a semiconductor absorber layer, crystalline silicon technologies, or others.

Module 10 is oriented to receive sunlight through a front layer 110. The sunlight is then converted to electricity using semiconductor materials embedded therein. To properly manage this conversion process, module 10 can be divided into a plurality of PV cells formed between front layer 110 and back plate 140 and arranged across the module. The cells can be connected in series, parallel, or a combination thereof depending on the desired electrical output from module 10.

Front layer 110 is the outermost layer of the module 10, and is also the first layer that incident light encounters upon reaching module 10. Front layer 110 may be composed of a substrate that is both durable and highly transparent, such as, for example, borosilicate glass, soda lime glass, or float glass. Back plate 140 together with front layer 110 encloses module 10 with an edge-insulating seal 245 provided therebetween. Back plate 140 can be composed of any suitable protective material, and is typically formed of a substrate such as borosilicate glass, float glass, soda lime glass, carbon fiber, or polycarbonate. Back plate 140, front layer 110, and insulating seal 245 protect the plurality of layers of module 10 from moisture intrusion, physical damage, or environmental hazards.

As shown in FIG. 2, external conductors 120, 125 facilitate connection and transmission of the electrical current generated by module 10 to other electrical devices or loads. External conductors 120, 125 may be any appropriate electrically conductive wires or cables, and may include insulating jackets surrounding their conductive core. External conductors 120, 125 may include industry-standard connectors 130, 135 for ease of installation and interconnection with other elements in a photovoltaic system. A conductor interface 150, also termed a junction box or cord plate, installed on back plate 140 of module 10 houses the interconnections of positive and negative internal busses of module 10 with respective external conductors 120, 125. Brackets 115 may be connected to module 10 (for example, to peripheral edges of front layer 110 and back plate 140) for use in fixing module 10 to a support structure.

In order to identify and track individual photovoltaic modules 10 during a fabrication process and/or deployment in a solar farm, a unique barcode or other identifying mark may be placed on one of the substrates of the module (e.g., front layer 110 or back plate 140). FIG. 3 shows one example of a barcode 30 that may be placed on the front layer 110 or back plate 140 of module 10. Barcode 30 is a two-dimensional dot matrix bar code. It should be understood, however, that any type of bar code can be used, including any two-dimensional or matrix barcode, such as a stacked barcode involving multiple rows of vertical bars arranged on top of one another, a one-dimensional (also referred to as "linear") bar code, a human readable barcode, a shape, a graphic, or any other suitable identifying mark which can be used to identify and track individual photovoltaic modules 10 during or after fabrication. In addition to identifying the unique marked module 10, barcode 30 may also identify other characteristics about the marked module 10, such as the manufacturer and manufacturing line, the type of photovoltaic technology that the module 10 employs, and other characteristics.

FIG. 4 shows a portion of a sequential manufacturing process 40 for module 10. Various processing stages 410, 420, 430 of a photovoltaic module manufacturing line are depicted. For example, processing stages 410, 420, 430 may be used to deposit and/or treat various material layers on a substrate during manufacture of module 10. A laser marking process, in which a barcode or other identifying mark is applied to the module using a laser head, can be performed at any stage of the manufacturing process. For example, the laser marking process may be performed at the beginning of a manufacturing line, such as when a substrate, e.g., a starting glass used for the front layer 110 or back plate 140 of FIGS. 1 and 2, first enters the manufacturing line. Alternatively, the laser marking process may be performed at an end location in the manufacturing line, such as when the completed photovoltaic module 10 exits the manufacturing line, or at some location between the various processing stages 410, 420, 430.

In order to maintain throughput of the process 40 with independent marking of the manufactured module 10, a marking device is dedicated to each manufacturing line. Thus, if multiple manufacturing lines are operated concurrently, or if the module formation processes occur faster than the marking process, multiple laser marking devices are required. Operating multiple spaced apart laser marking devices adds additional fixed costs (for multiple marking devices) and operational costs (workers and/or maintenance for each marking device) to the manufacturing process 40.

Alternatively, a single laser marking device may be used to mark modules for multiple manufacturing lines, but this may result in a bottleneck at the marking location.

In addition, in the event that a laser head or lens of the laser marking device requires maintenance or replacement, the laser marking device must be deactivated and the one or more manufacturing lines that it services stopped while the laser head is repaired or replaced. Furthermore, certain lasers, such as $CO_2$ laser heads, utilize gas as an active medium to amplify the light signal, and discharge this gas during normal operation. The lenses of such laser heads require regular maintenance during normal operation, which also requires deactivating the laser head and stopping the manufacturing line.

Accordingly, there is continuing need for an object marking method and apparatus providing greater efficiency in both fixed and operational costs and manufacturing time.

BRIEF DESCRIPTION OF THE DRAWINGS

FIGS. 5A-5E illustrate aspects of a laser marking device, in accordance with embodiments described herein.

FIGS. 6A-6B illustrate a slidable mechanism of a laser marking device, in accordance with embodiments described herein.

DETAILED DESCRIPTION

In the following detailed description, reference is made to the accompanying drawings which form a part hereof, and which illustrate specific embodiments of the invention. These embodiments are described in sufficient detail to enable those of ordinary skill in the art to make and use them. It is also understood that structural, logical, or procedural changes may be made to the specific embodiments disclosed herein. Although the following description describes method and apparatus embodiments for marking objects such as substrates used in photovoltaic module manufacturing or completed or partially completed photovoltaic modules, it should be understood that the methods and apparatuses described herein can be used to mark any object capable of being laser marked.

FIGS. 5A-5E illustrate one embodiment of a laser marking device 500. Device 500 includes a transport system, such as one or more conveyor belts 510, 512, 514, for transporting one or more objects to be marked in a direction D across device 500.

Figure 1:
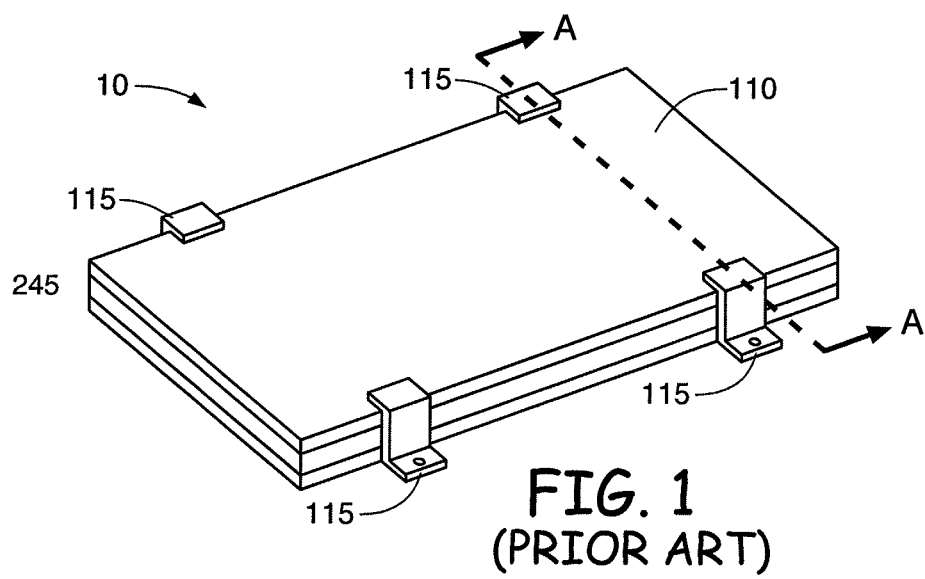
FIG. 1 illustrates a top perspective view of an example photovoltaic module.
Figure 2:
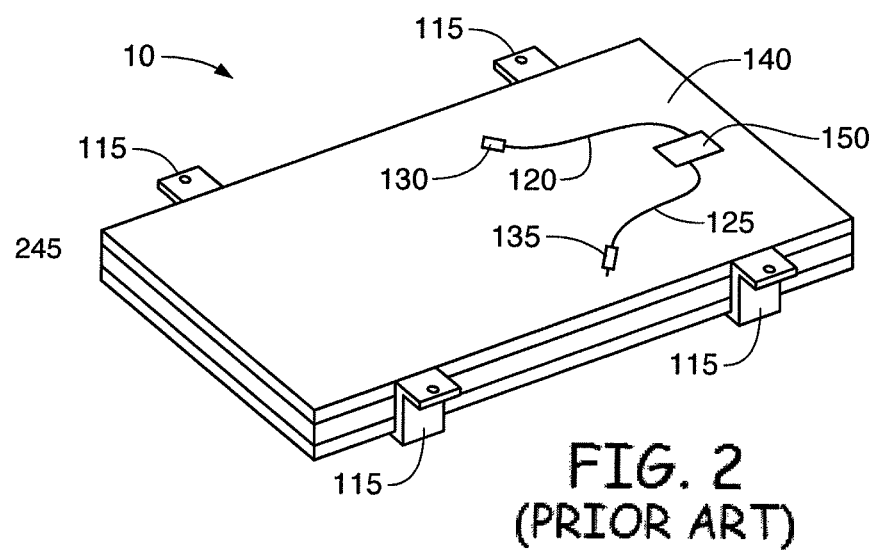
FIG. 2 illustrates a bottom perspective view of an example photovoltaic module.
Figure 5B:
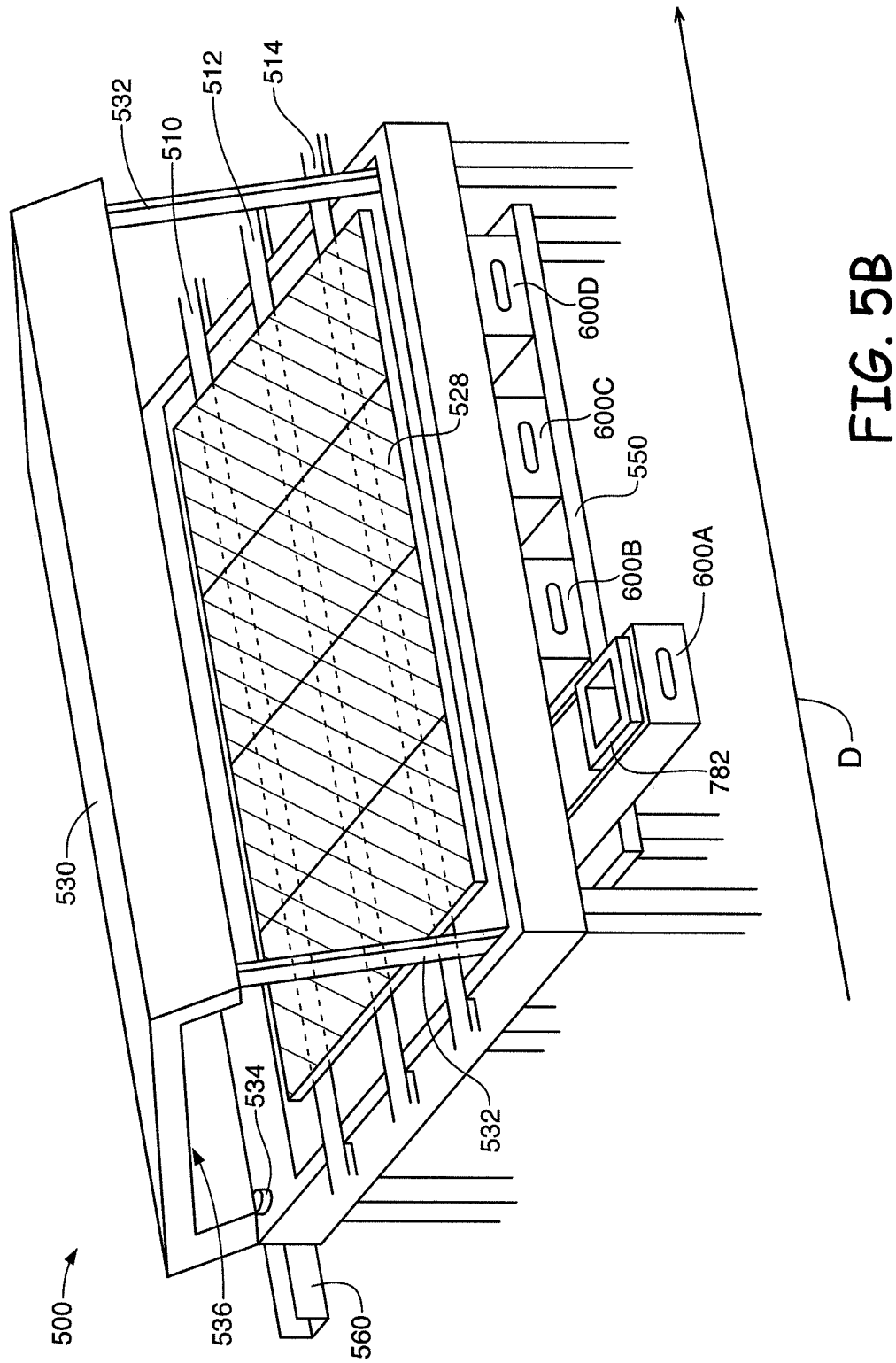

As shown in FIG. 5A, the one or more objects to be marked by device 500 may be multiple substrates 520, 522, 524, 526, such as for respective front layers 110 or back plates 140 of FIGS. 1 and 2, upon which photovoltaic module structures can be built, or multiple completed or partially-completed photovoltaic modules 10 (FIGS. 1 and 2). Alternatively, as shown in FIG. 5B, the one or more objects to be marked may include a subassembly 528 including multiple substrates for multiple photovoltaic modules that have been formed as a single piece, which can later be separated into individual substrates (e.g., substrates 520, 522, 524, 526).

A surface to be marked on each respective substrate 520, 522, 524, 526 faces downward resting upon conveyor belts 510, 512, 514. Device 500 also includes a cover 530 that may be configured to enclose the substrates 520, 522, 524, 526 or subassembly 528 on the conveyor belts 510, 512, 514 during operation of device 500. Cover 530 can be propped open by one or more mechanical locking bars 532, when, for example, it is necessary to move or adjust (i.e., raise, lower, or adjust horizontally) the conveyor belts 510, 512, 514 or the objects to be marked.

Figure 5C:
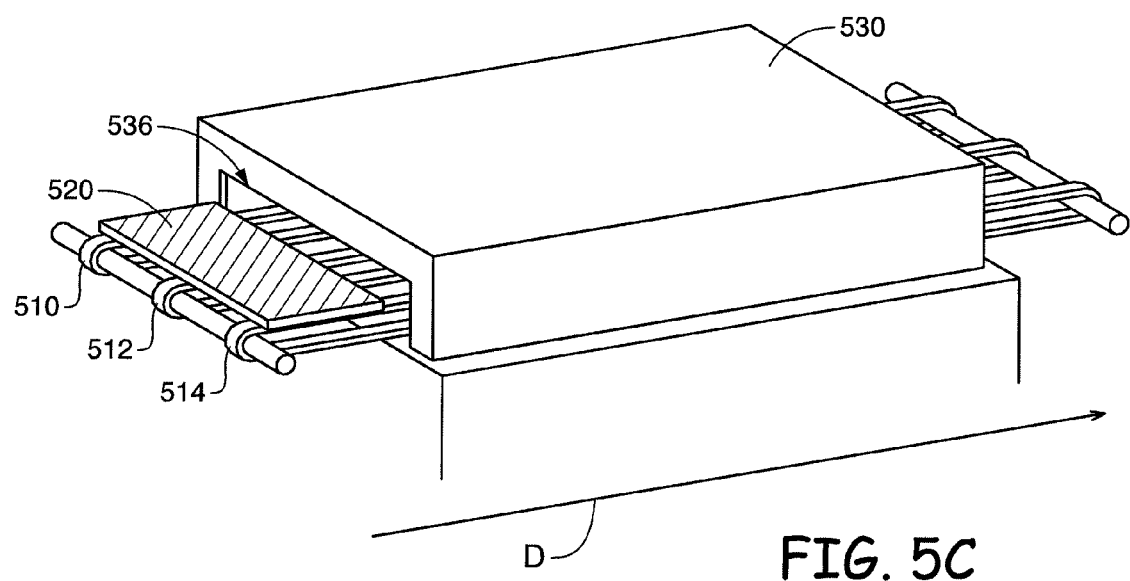

As shown in more detail in FIG. 5C, cover 530 may include an opening 536 traversing the length of the cover 530. Opening 536 permits the object to be marked, e.g., substrates 520, 522, 524, 526, or subassembly 528, to be transported along conveyor belts 510, 512, 514 with cover 530 closed.

Figure 5D:
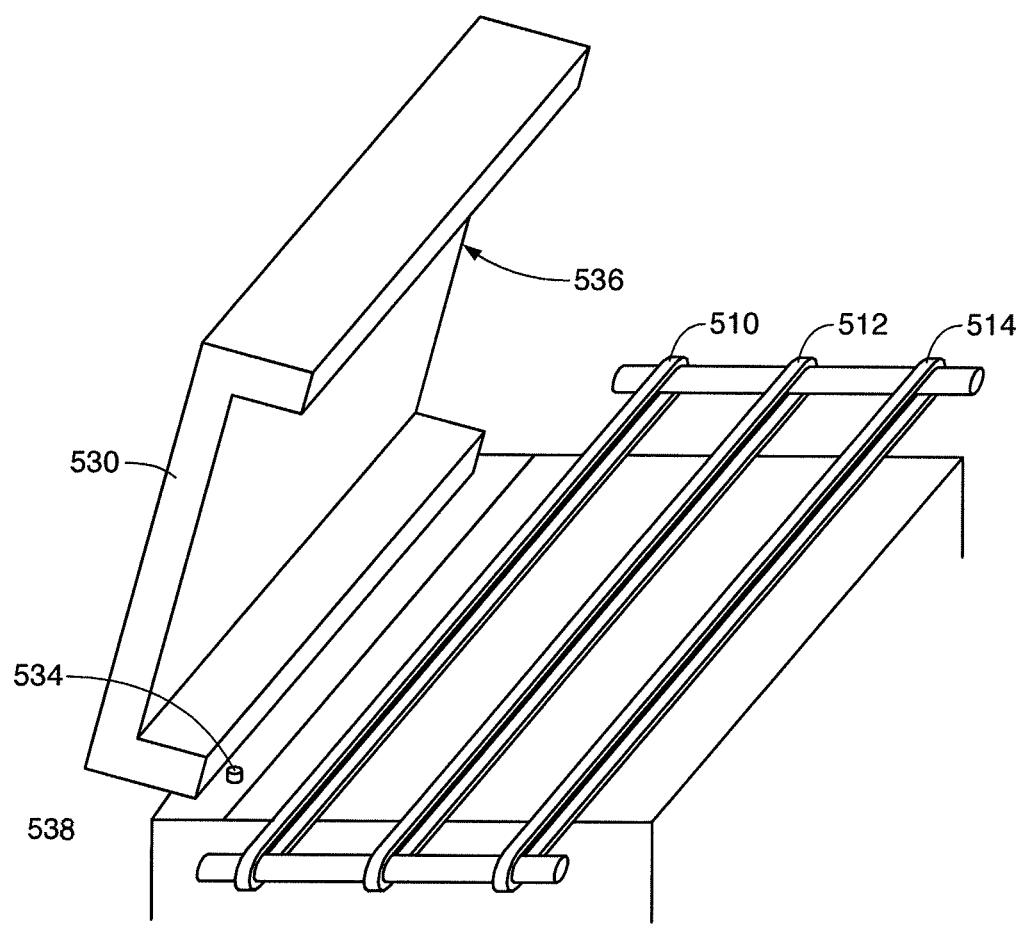

As shown in more detail in FIG. 5D, device 500 also includes one or more sensors 534 configured to detect when cover 530 is open. For example, sensor 534 may be a pressure-activated switch located at or near a hinge 538 of cover 530.

Figure 5E:
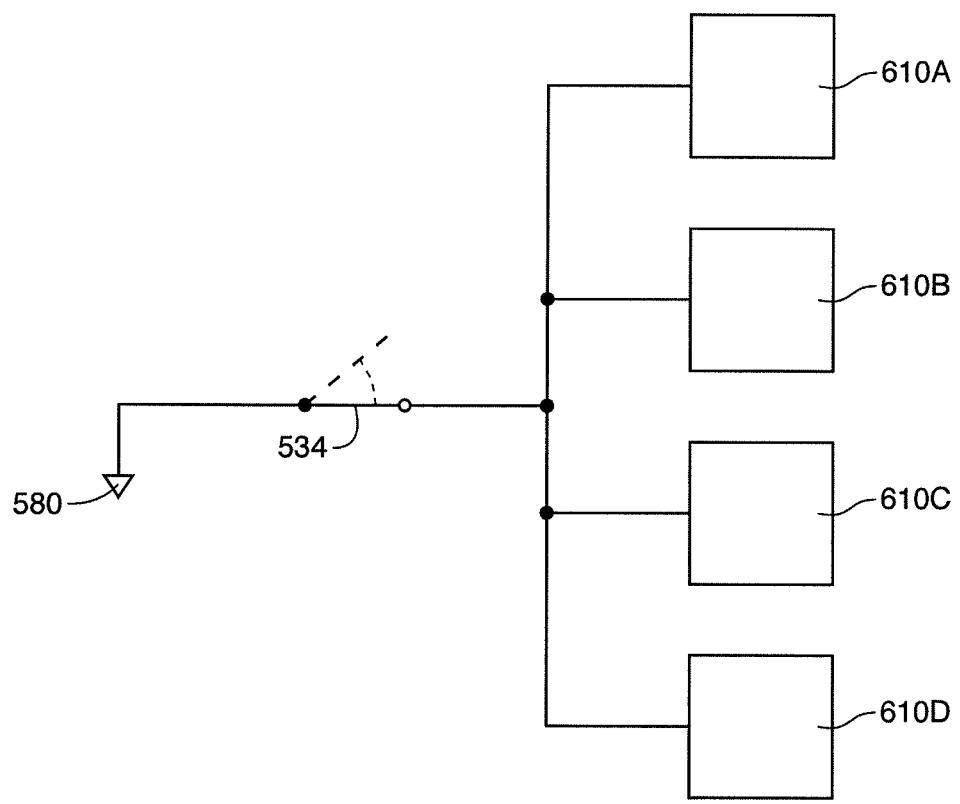

A schematic diagram illustrating the operation of sensor 534 is shown in FIG. 5E. Sensor 534 is located between a power source 580 and multiple laser heads 610a-d. Power source 580 may be, for example, an AC or DC power source configured to provide power to the multiple laser heads 610a-d of device 500 (FIGS. 5A, 5B). As described further below in connection with FIGS. 6A and 6B, each laser head 610a-d may be, for example, a carbon dioxide ($CO_2$) laser marking head.

Sensor 534 operates as an electrical switch, having a closed position 534a that electrically couples power from power source 580 to all of the laser heads 610a-d of device 500 when cover 530 is closed, and having an open position 534b electrically decoupling power from power source 580 to the laser heads 610a-d when cover 530 is open. Sensor 534 provides protection during normal use of device 500, allowing for a rating as a Class 1 device (rated as safe under all conditions of normal use) as specified by the International Electrotechnical Commission (IEC) 60825-1 standard.

Figure 6A:
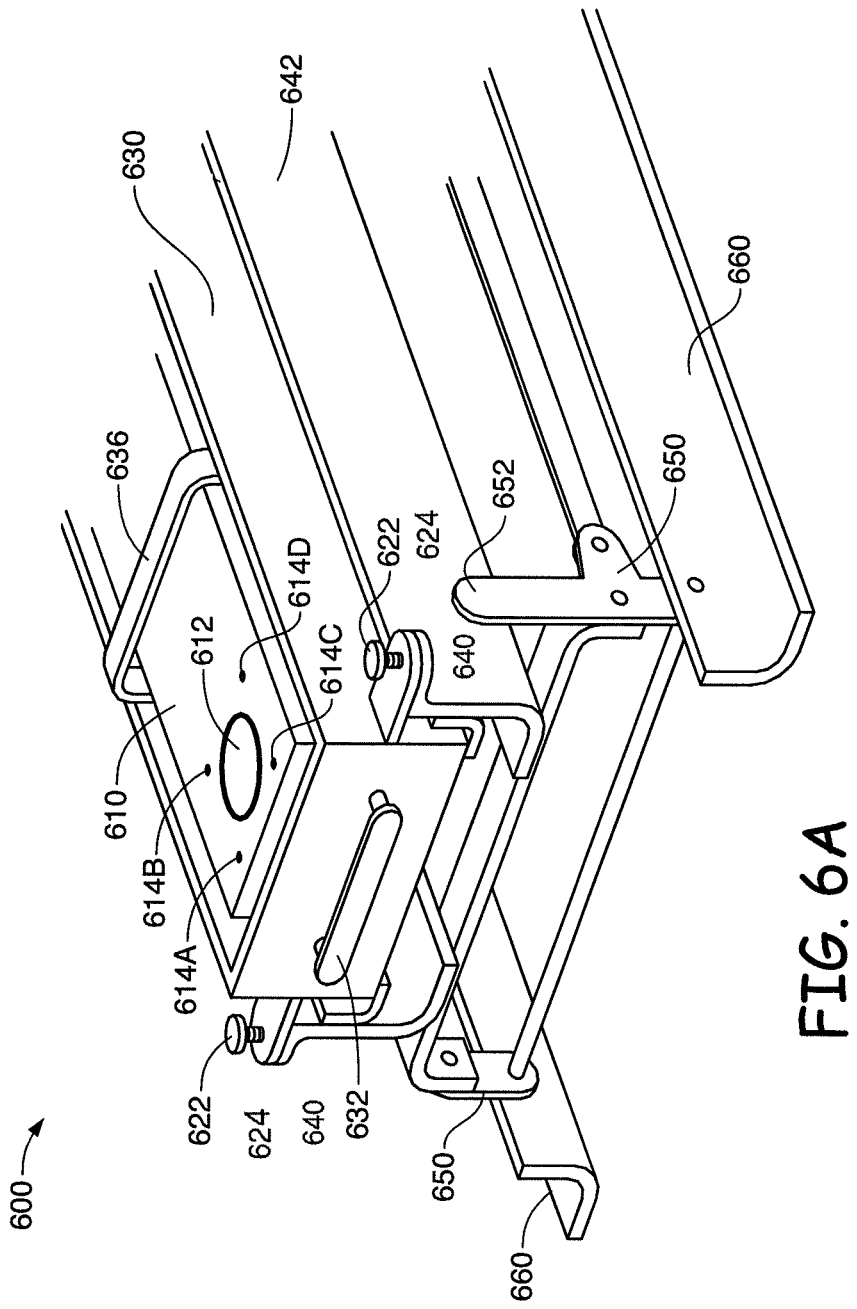

Device 500 also includes a mechanical support structure 550 for supporting multiple laser heads 610, which are shown in greater detail in FIG. 6A. The respective laser heads 610 are held in respective supporting slidable mechanisms 600a, 600b, 600c, 600d of support structure 550. Although four separate slidable mechanisms 600a, 600b, 600c, 600d for supporting respective laser heads 610 are shown in FIGS. 5A and 5B, it should be understood that device 500 may include more or fewer slidable mechanisms to correspond to the number of laser heads used in device 500.

Each slidable mechanism 600a, 600b, 600c, 600d operates like a drawer, in that the slidable mechanism is capable of being independently slid between an engaged "closed" position within device 500 for a marking operation and a disengaged pulled out or "open" position for maintenance, repair, and replacement of the laser head 610 (FIG. 6A) that is contained therein. As shown with slidable mechanism 600a in FIGS. 5A and 5B, each slidable mechanism 600a, 600b, 600c, 600d is configured to slide in a direction perpendicular to the direction of movement D of the conveyor belts 510, 512, 514, in order to be accessible even when other devices in the manufacturing process are located upstream or downstream of device 500.

The slidable mechanisms 600a, 600b, 600c, 600d hold the respective laser heads 610 (FIG. 6A) so they are spaced in series along the direction D, such that substrates 520, 522, 524, 526, or four later severed substrates formed as a single piece subassembly 528, may be marked independently and simultaneously, for example, with a barcode 30. Returning briefly to FIG. 5A, device 500 also includes a wiring duct 560 for running electric power and communication interface wiring to the multiple laser heads 610 (FIG. 6A).

Referring to FIG. 6A, each slidable mechanism 600 holds a laser head 610. Each laser head 610 may be, for example, a carbon dioxide ($CO_2$) laser marking head, such as a Synrad® Fenix Flyer $CO_2$ Laser Marker head, or another laser head configured to provide marking on a substrate.

Laser head 610 outputs a beam of light, e.g., infrared light, through a lens 612. Lens 612 may have a focal length (also referred to as a "working distance") within a range of 80 mm to 370 mm. Each lens 612 is configured to focus the beam of light from laser head 610 to a desired size at a working distance W (FIG. 8) from lens 612, e.g., 50 to 500 mm from lens 612, depending on the selected lens. Each laser head 610 also includes multiple connector slots 614a-d, which are configured to attach an insulating baffle 782 (FIG. 7B) that surrounds lens 612 to laser head 610.

On each side and at the front, slidable mechanism 600 includes a protective outer surface 630. The sides of protective outer surface 630 rests on and slides along slidable bearings 640 that are fixed to outer walls 642 on both sides of slidable mechanism 600. Slidable mechanism 600 includes a handle 632 for moving slidable mechanism 600 in a direction perpendicular to the direction D of conveyor belts 510, 512, 514, along slidable bearing 640. Slidable mechanism 600 moves from an engaged and operative position, where laser head 610 is within device 500 and can mark a substrate or module, to a disengaged and inoperative position that permits access to laser head 610, such as for repair, maintenance, or replacement. FIGS. 5A, 5B show one slidable mechanism 600a in a disengaged and inoperative position, and the other slidable mechanisms 600b, 600c, 600d in an engaged and operative position. Slidable mechanism 600 also includes a bracket 636 for retaining laser head 610 in position during normal operation.

Locator pins 622 on one or both sides of slidable mechanism 600 engage with a locking mechanism 624 on fixed outer wall 642, which causes the slidable mechanism 600 to be locked in an engaged position. Locator pins 622 may also operate sensors 623a-d (FIG. 6B) to automatically disable the respective laser head 610 from operation when slidable mechanism 600 is not locked in the engaged position, making device 500 (FIGS. 5A, 5B) safer for normal uses and allowing for a rating as a Class 1 laser device.

A schematic diagram illustrating the safety operation of sensors 623a-d is shown in FIG. 6B. Sensors 623a-d may be sensors that are controlled as electrical switches by respective locators pins 622 of each slidable mechanism 600a-d, each having a closed position that electrically couples power from power source 580, e.g., an AC or DC power source, to a respective one of the laser heads 610a-d of device 500 when the respective locator pin 622 is in an engaged position, and each having an open position that electrically decouples power from power source 580 to the respective one of the laser heads 610a-d when the respective locator pin 622 is in a disengaged position. Alternatively, or in addition, sensors 623a-d may include one or more pressure-sensitive sensors, corresponding to each slidable mechanism 600a-d and located at a rear side of the mechanical support structure 550 (FIGS. 5A, 5B), which can couple or decouple power to the respective laser heads 610a-d. It should be noted that the switches of sensors 623a-d may be collectively connected in series with the switch of cover sensor 534 (FIG. 5E).

Referring back to FIG. 6A, slidable mechanism 600 is attached to a caroming device 650 that is mounted on a lower support bracket 660 of mechanical support structure 550. Caroming device 650 may be, for example, a hinge that permits raising and lowering of slidable mechanism 600 using a lever 652. As discussed further below in connection with FIGS. 7-8, slidable mechanism 600 can be raised using camming device 650 to engage a baffle 782 with a baffle box 770 located directly beneath a location of an object to be marked, placing a laser head 610 in position for marking.

Figure 7A:
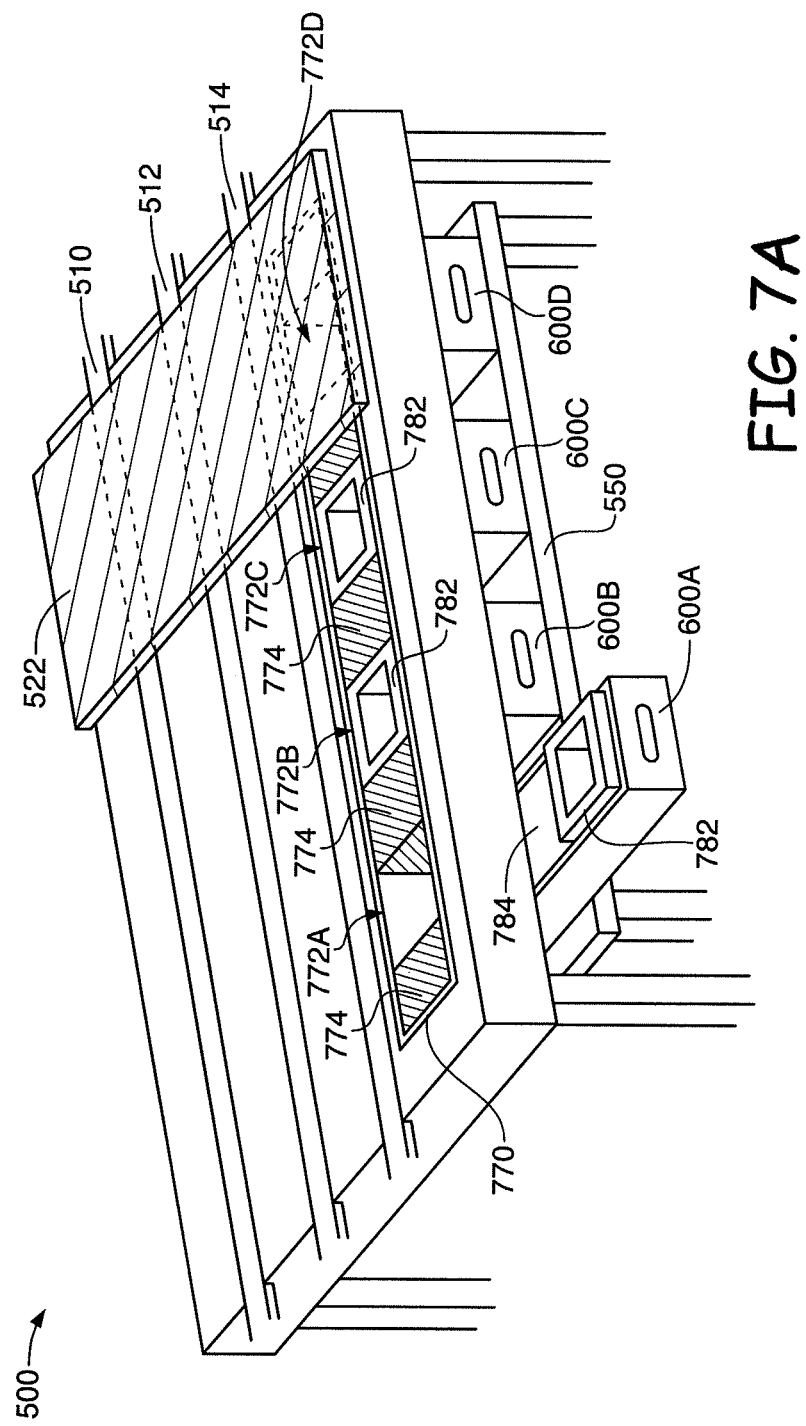
FIG. 7A illustrates a laser marking device, in accordance with embodiments described herein.

FIG. 7A illustrates additional isolation and safety features of device 500. For purposes of clarity, certain features of device 500 described in connection with FIGS. 5-6, such as a cover 530 and sensor 534, are not shown in FIG. 7. Also, for purposes of clarity, only a single substrate 522 is shown as being transported across conveyor belts 510, 512, 514. It should be understood, however, that device 500 is configured to mark multiple substrates 520, 522, 524, 526, or different areas of a subassembly 528 which can be severed into multiple substrates, or other objects to be marked.

As depicted in the disengaged slidable mechanism 600a of FIG. 7A, each slidable mechanism 600a-d includes a protective covering 784 over the respective laser head 610 (FIG. 6A). Protective covering 784 may be, for example, a metal or plastic material, which covers laser head 610 and bracket 636 (FIG. 6A) to protect the laser head 610 from substrate residue that may result during operation of device 500 to mark a substrate. It should be understood that each respective slidable mechanism 600b, 600c, 600d includes a similar protective covering 784.

FIG. 7A also shows a baffle box 770 beneath the conveyor belts 510, 512, 514 of device 500. Baffle box 770 runs across all of the slidable mechanisms 600a, 600b, 600c, 600d of device 500, and includes respective openings 772a, 772b, 772c, 772d that correspond to the respective laser heads 610 when held by the slidable mechanisms 600a, 600b, 600c, 600d in an operative position. Baffle box 770 can be a single piece of plastic, metal, or other appropriate isolating material. Each opening 772a, 772b, 772c, 772d in baffle box 770 is separated from other openings by isolating walls 774 of material to prevent interference between beams from neighboring laser heads 610.

As shown in FIG. 7A, a respective baffle 782 surrounding each laser lens 612 (FIG. 6A) is configured to fit within a respective opening 772a, 772b, 772c, 772d when the respective slidable mechanism 600a, 600b, 600c, 600d is in an engaged and operative position for marking an object. The baffle box 770 and baffle 782 providing laser light isolation between respective laser heads 610.

Slidable mechanisms 600a, 600b, 600c, 600d can be raised individually, (e.g., using respective calming devices 650 shown in FIG. 6A), such that the respective baffle 782 surrounding the lens 612 of each laser head 610 (FIG. 6A) engages a respective opening 772a, 772b, 772c, 772d in baffle box 770. Slidable mechanism 600 can be lowered using camming device 650 to disengage baffle 782 from baffle box 770 for repair, maintenance, and/or replacement of laser head 610 or lens 612.

Figure 7B:
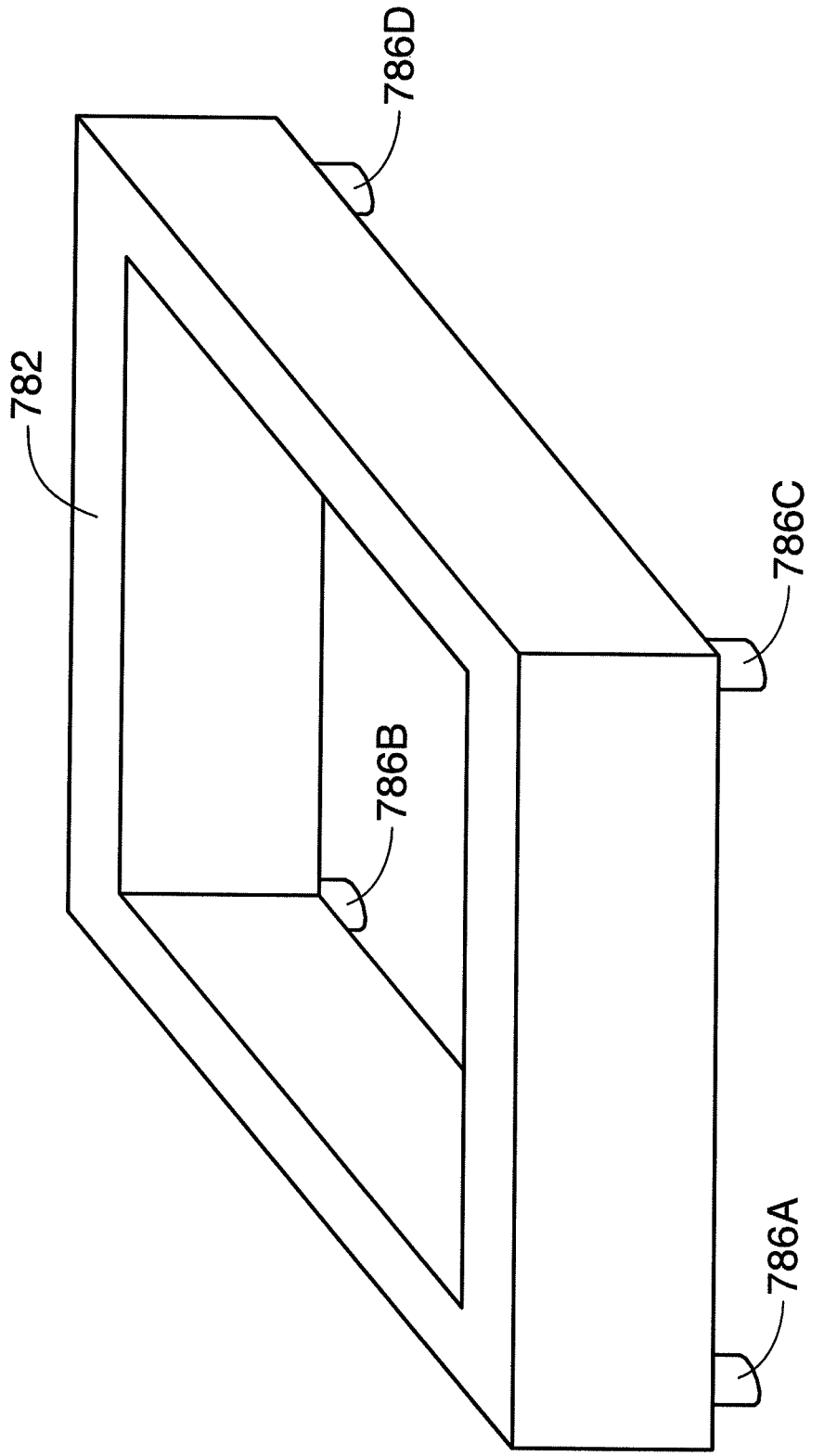
FIG. 7B illustrates a baffle for a laser marking device, in accordance with embodiments described herein.

FIG. 7B shows one example of a baffle 782. Baffle 782 includes an open center portion permitting a light beam from lens 612 to pass through the baffle 782 while isolating the light beam from surrounding laser heads 610. Connector pegs 786a-d corresponding to slots 614a-d on laser head 610 (FIG. 6A) are configured to attach baffle 782 to laser head 610.

Figure 8:
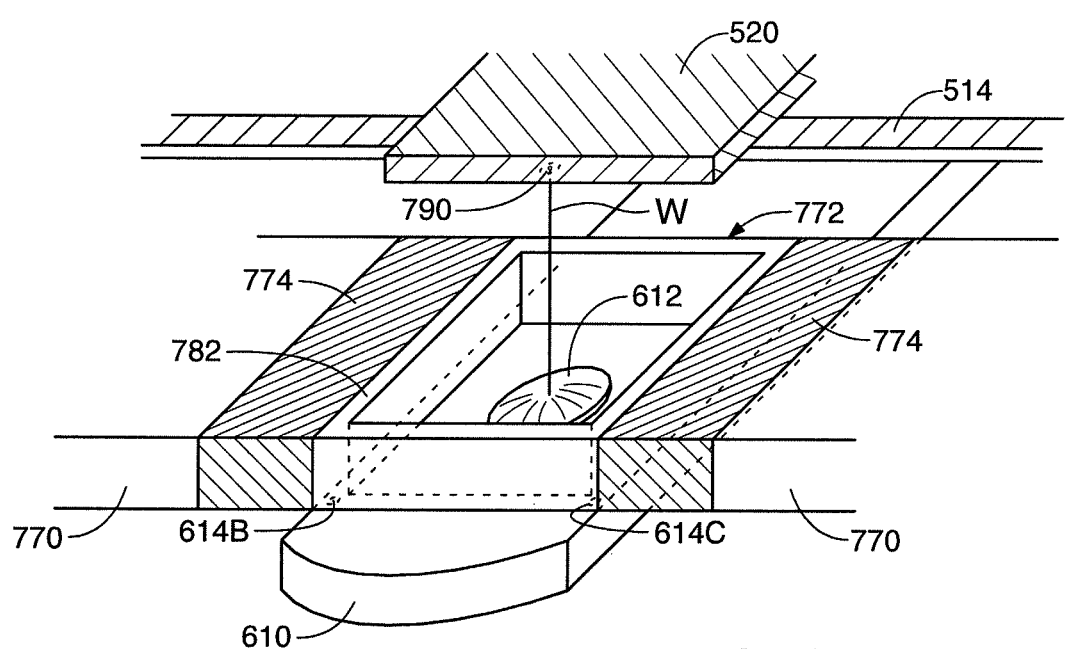
FIG. 8 illustrates another perspective of a laser marking device, in accordance with embodiments described herein.

FIG. 8 illustrates a laser head 610 with a baffle 782 surrounding a lens 612 in an engaged and operative position, where baffle 782 is engaged in a respective opening 772 of baffle box 770. As shown in FIG. 8, when engaged, baffle 782 and laser head 610 form a flush seal with opening 772 in baffle box 770, with lens 612 and baffle 782 protruding into opening 772.

When laser head 610 is engaged with baffle box 770 by a camming device 650 holding laser head 610 in a raised position, and a substrate 520 for marking is supported in position over lens 612 by one or more conveyor belts 510, 512, 514 (FIGS. 5A, 5B), lens 612 is maintained at a fixed working distance W from a desired marking area 790 on substrate 520. As noted above, working distance W may be in the range of 50 to 500 mm. The appropriate working distance W between lens 612 and marking area 790 may depend upon the particular type of laser head 610 and lens 612. For example, a $CO_2$ marking laser head 610 with a 370 mm lens 612 may have a typical working distance in a range of approximately 335-345 mm, while a $CO_2$ marking laser head 610 with a 125 mm lens 612 may have a typical working distance in a range of approximately 126-130 mm.

Referring again to FIG. 7A, slidable mechanisms 600a, 600b, 600c, 600d can be lowered individually, to disengage the respective baffle 782 from the baffle box 770 and permit a respective slidable mechanism (e.g., slidable mechanism 600a) to move to a disengaged and inoperative position for repair, maintenance, and/or replacement of laser head 610 or lens 612 (FIG. 6A), while the respective laser heads 610 of other slidable mechanisms (e.g., slidable mechanisms 600b, 600c, 600d) remain in an engaged and operative position. Because each laser head 610 can be repaired, maintained, and/or replaced within a matter of minutes, there is little down time associated with laser head maintenance, thus limiting disruption of a conveyor line manufacturing process.

Figure 9A:
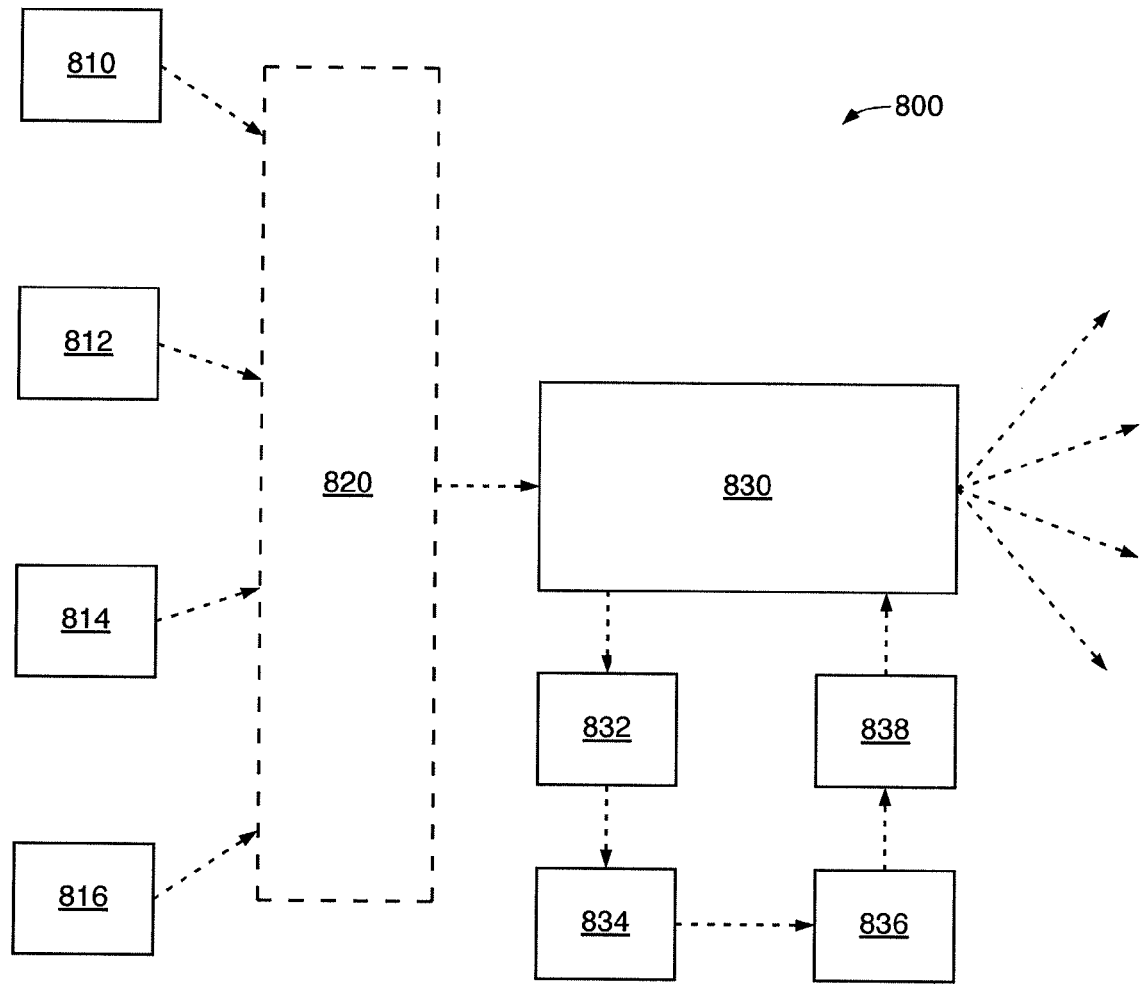
FIGS. 9A and 9B illustrate manufacturing processes for photovoltaic modules, in accordance with embodiments described herein.
Figure 9B:
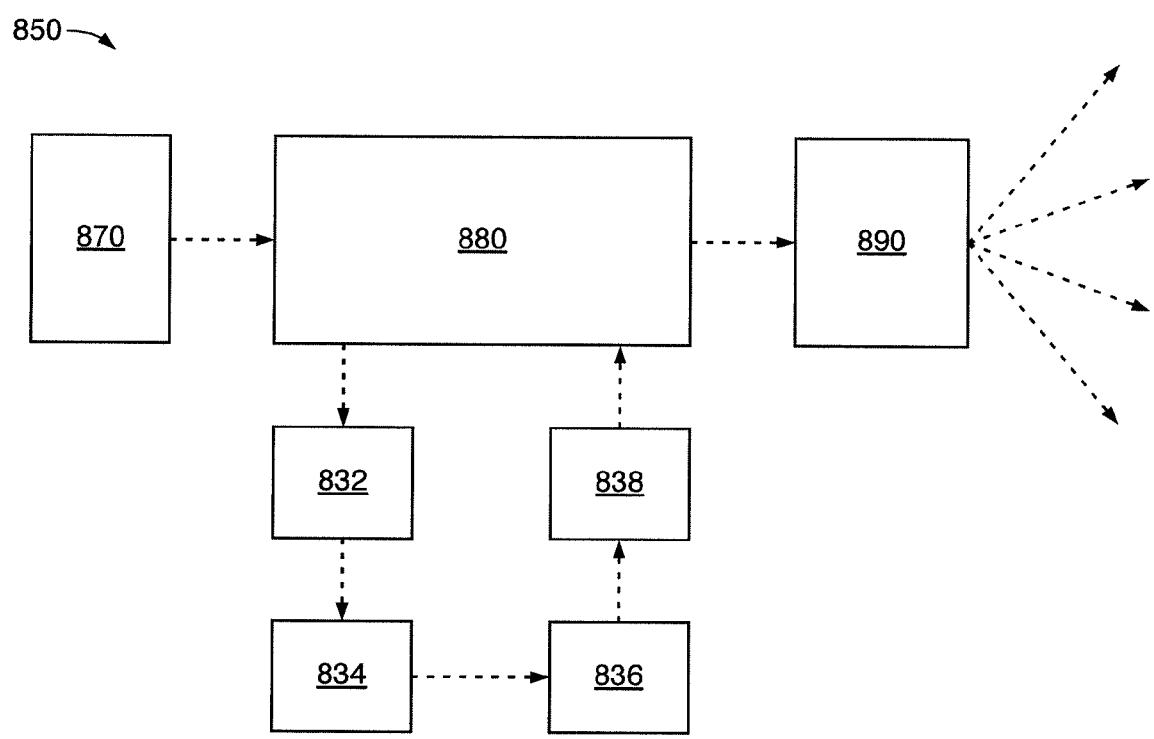

FIGS. 9A and 9B illustrate portions of respective manufacturing process 800, 850 for photovoltaic modules, employing a laser marking device 500, in accordance with embodiments described above in connection with FIGS. 5-8.

FIG. 9A shows a portion of a manufacturing process 800 for multiple substrates (e.g., substrates 520, 522, 524, 526 of FIG. 5A), or for multiple completed or partially completed photovoltaic modules. In steps 810, 812, 814, and 816, respective substrates are formed using known manufacturing methods. For example, in steps 810, 812, 814, and 816, the respective pieces of glass may be cut and shaped to a desired size. In another embodiment, steps 810, 812, 814, and 816 may also include the formation of multiple layers (e.g., a TCO stack layer) on the respective pieces of glass.

In step 820, the respective substrates from steps 810, 812, 814, 816 are transported onto a staging area, which may be, for example, a conveyor system that receives multiple objects to be marked in parallel and outputs them serially to device 500 (FIG. 5A). In step 830, the substrates 520, 522, 524, 526 are transported in series onto laser marking device 500 by conveyor belts 510, 512, 514. Each substrate 520, 522, 524, 526 is moved into position over a respective laser head 610 held by one of slidable mechanisms 600a-d (FIG. 5A).

Figure 3:
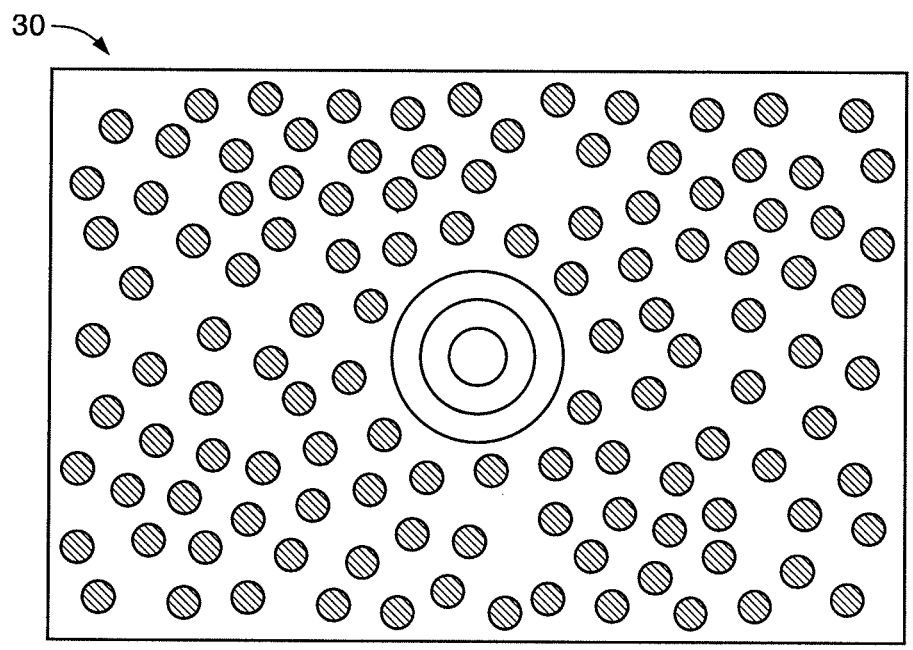
FIG. 3 illustrates one example of a barcode that may be placed on a photovoltaic module.
Figure 4:
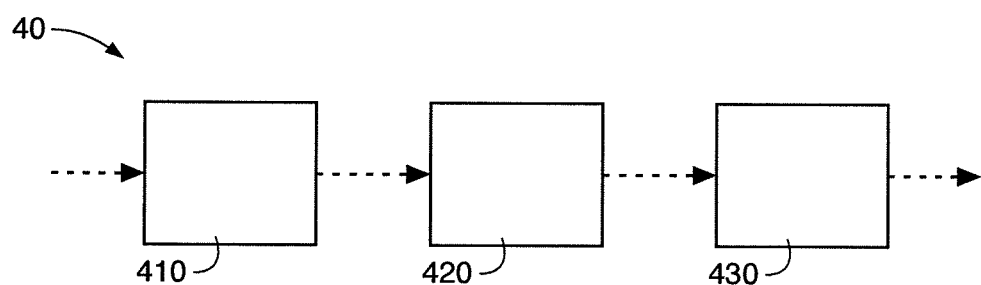
FIG. 4 illustrates a portion of a conventional manufacturing process for a photovoltaic module.

Each substrate 520, 522, 524, 526 is subjected to a marking process, where barcode 30 (FIG. 3) or other identifying markings may be formed on an exterior surface of each respective substrate 520, 522, 524, 526 that is facing the respective laser head 610. Laser marking device 500 permits simultaneous and independently controlled marking of each respective substrate 520, 522, 524, 526 using a single machine. Device 500 also allows substrates 520, 522, 524, 526 to be marked serially by any one of the laser heads 610. Consequently, Device 500 is also capable of maintaining throughput for the manufacturing process 500 and permits independent maintenance, repair, and replacement of the respective laser heads 610 or lenses 612 (FIG. 6A), while maintaining operation of other laser heads 610. Any one, two, or three of the four laser heads 610 can be down for repair, etc., without stopping the production line since the remaining laser head(s) 610 remain in operation. After the marking process in step 830, the respective substrates 520, 522, 524, 526 may be offloaded and subjected to further manufacturing processes to form completed photovoltaic modules 10 (FIGS. 1 and 2).

Steps 832-838 illustrate the capability to provide for maintenance, repair, or replacement of one or more laser heads 610 (FIG. 6A) of device 500 while maintaining operation of one or more other laser heads 610 of device 500. In step 832, a respective laser head 610 that requires maintenance, repair, or replacement is powered down. In step 834, the respective slidable mechanism 600 holding the laser head 610 that is being maintained, repaired, or replaced (e.g., one of slidable mechanisms 600a, 600b, 600c, 600d of FIG. 5A) is moved to a disengaged position, for example, by first disengaging the slidable mechanism 600 from the baffle box 770 by operation of the camming device 650 (FIG. 6A), and then sliding the slidable mechanism 600 in a direction perpendicular to the transport direction D of the conveyor belts 510, 512, 514 (FIG. 5A), and away from the marking device 500.

In step 836, the desired maintenance, repair, or replacement of the disengaged laser head 610 is performed. Other laser heads 610 of device 500 remain in operation.

In step 838, the respective slidable mechanism 600 holding the maintained, repaired, or replacement laser head 610 is re-engaged with the marking device 500, for example by sliding the slidable mechanism 600 in a direction perpendicular to the transport direction D of the conveyor belts 510, 512, 514, and toward the marking device 500, and reengaging the slidable mechanism 600 with the baffle box 770 by operation of the camming device 650 (FIG. 6A).

It should be understood that certain techniques may be employed to ensure marking of all substrates despite one or more laser heads 610 being inoperative during the marking process. For example, output of the staging area in step 820 may be controlled to only output a number of substrates onto device 500 that corresponds to the number of operative laser heads 610, and conveyors belts 510, 512, 514 can be controlled to position the substrates over only the operative laser heads 610. As another example, conveyor belts 510, 512, 514 and the operative laser heads 610 in device 500 may be controlled, after the laser marking process, to move a substrate positioned over an inoperative laser head 610 into position over an operational laser head 610, and perform a separate marking process. Alternatively, manufacturing specifications may not require that every substrate or module be marked, and thus the laser marking process could proceed without adjusting for one or more laser heads 610 being inoperative.

FIG. 9B shows a portion of a manufacturing process 850 including laser marking of a subassembly 528 (FIG. 5B) including multiple substrates formed as a single piece of glass that can later be severed. Process 850 may occur, for example, at a beginning of a manufacturing line, prior to separation of the subassembly 528 into multiple separate substrates.

In step 870, one or more layers, such as a TCO stack layer, may be formed on one side of subassembly 528, using known manufacturing methods. Alternatively, step 870 may occur after the marking process of step 880 (discussed below), or after separation of the subassembly 528 in step 890.

In step 880, the subassembly 528 is subjected to a marking process, where barcode 30 (FIG. 3) or other identifying markings may be formed on the exterior surface of each respective area of the subassembly 528 corresponding to later severed substrates using a laser marking device 500 (FIG. 5-8). Laser marking device 500 permits simultaneous and independently controlled marking of each respective substrate of the subassembly 528 using a single machine.

Steps 832-838, illustrating the capability to provide for maintenance, repair, or replacement of one or more laser heads 610 (FIG. 6A) of device 500 while maintaining operation of one or more other laser heads 610 of device 500, are substantially identical to steps 832-838 described in connection with FIG. 9A, and will not be repeated here. As in the maintenance, repair, or replacement operation described in connection with process 800, in process 850, conveyor belts 510, 512, 514 and other laser heads 610 remaining in operation in device 500 may be controlled, after the laser marking process, to move a substrate within subassembly 528 that is positioned over an inoperative laser head 610 into position over an operational laser head 610, and perform a separate marking process. Alternatively, manufacturing specifications may not require that every substrate in the subassembly 528 be marked, and thus the laser marking process could proceed without adjusting for one or more laser heads 610 being inoperative.

In step 890, the subassembly 528 may be separated, using, for example, a mechanical or laser cutting device, into multiple individual substrates. Further processing to form photovoltaic modules 10 (FIG. 2) upon each of the individual substrates, such as the formation of one or more interior layers, laser scribing of interconnected photovoltaic cells, placement of a back plate 140 (FIG. 2), and a heating and/or vacuum process, may then be performed on each separate photovoltaic module.

Details of one or more embodiments are set forth in the accompanying drawings and the above description. Other features, objects, and advantages will be apparent from the description, drawings, and claims. Although a number of embodiments of the invention have been described, it will be understood that various modifications may be made without departing from the spirit and scope of the disclosure. For example, it should be understood that, while certain embodiments have been described in connection with the manufacture of photovoltaic modules, the described embodiments may also be equally applicable to marking of other objects. In addition, while certain embodiments have been described in connection with lasers for marking objects, the lasers may be used for other purposes, such as scanning of objects or cutting objects. It should also be understood that processes described herein may include more or fewer steps, and steps therein need not necessarily be performed in the order they are described unless specifically stated. It should also be understood that the appended drawings are not necessarily to scale, presenting a somewhat simplified representation of various features and basic principles of the invention.

Accordingly, the scope of the described invention is not limited to the specific embodiments described above, but only by the scope of the appended claims.

What is claimed as new and desired to be protected by Letters Patent of the United States is:

1. A laser marking device comprising:
   a transport mechanism for transporting at least one object to a position for laser marking;
   a support structure arranged to support a plurality of laser heads for marking the at least one transported object;
   a plurality of slidable mechanisms associated with the support structure each for holding and slidably moving a respective laser head into the laser marking device to an engaged position where the laser head is operable to mark a transported object, and out of the laser marking device to a disengaged position where the laser head is inoperable and accessible to an operator; and
   a baffle box comprising a plurality of openings for receiving respective baffles of the laser heads;
   wherein each of the laser heads comprises:
      a lens for emitting a light beam; and
      a baffle surrounding the lens for isolating the light beam.

2. The laser marking device of claim 1, wherein the transport mechanism includes at least one conveyor configured to transport the at least one object.

3. The laser marking device of claim 1, wherein the plurality of slidable mechanisms are configured to slide in a direction perpendicular to an object transport direction.

4. The laser marking device of claim 1, wherein each of the slidable mechanisms is configured to permit removal of the respective laser head when the slidable mechanism moves the respective laser head to the disengaged position.

5. The laser marking device of claim 1, wherein each of the slidable mechanisms further comprises a respective camming mechanism configured to move a respective laser head held by the slidable mechanism into a position where a respective baffle of the respective laser head is located within an opening in the baffle box.

6. The laser marking device of claim 5, each of the slidable mechanisms further comprises a lever for operating the respective camming mechanism.

7. The laser marking device of claim 1, wherein each of the slidable mechanisms comprises a mechanism for retaining the respective slidable mechanism in the engaged position.

8. The laser marking device of claim 7, wherein the mechanism for retaining the respective slidable mechanism in the engaged position includes at least one locator pin for engaging with a locking mechanism on a fixed wall of the laser marking device.

9. The laser marking device of claim 1, further comprising a sensor configured to prevent a respective laser head from operating when a respective slidable mechanism holding the one laser head is in the disengaged position.

10. The laser marking device of claim 9, wherein, when a respective slidable mechanism holding a respective laser head is in the disengaged position, at least one other laser head remains in the engaged position and is operational.

11. The laser marking device of clam 1, further comprising a cover for enclosing a portion of the transport mechanism.

12. The laser marking device of claim 11, further comprising a sensor configured to prevent the at least one laser head from operating when the cover is open.

13. The laser marking device of claim 1, wherein the plurality of slidable mechanisms comprises four slidable mechanisms.

14. The laser marking device of claim 1, wherein at least one laser head comprises a carbon dioxide laser head.

15. The laser marking device of claim 1, wherein the at least one object comprises a plurality of substrates for marking by the plurality of laser heads.

16. The laser marking device of claim 1, wherein the at least one object comprises a subassembly including plurality of severable substrates formed as a single piece for marking by the plurality of laser heads.

17. The laser marking device of claim 1, wherein the at least one object comprises a plurality of photovoltaic modules.

18. A laser marking device comprising:
   a transport mechanism for transporting at least one object to a position for laser marking;
   a support structure arranged to support a plurality of laser heads for marking the at least one transported object, the laser support structure comprising:
      a plurality of slidable mechanisms, wherein each slidable mechanism is configured to hold a respective one of the plurality of laser heads and to slide from an engaged position where an object can be marked to a disengaged position where the laser head is accessible, wherein each of the laser heads comprises a lens for emitting a light beam and a baffle surrounding the lens for isolating the light beam;
      a baffle box comprising a plurality of openings for receiving the respective baffles of the laser heads; and
      wherein each of the slidable mechanisms further comprises a respective camming mechanism configured to move a respective laser head held by the slidable mechanism into a position where a respective baffle is located within an opening of the baffle box.

19. The laser marking device of claim 18, wherein each of the slidable mechanisms further comprises a lever for opening the respective camming mechanism.

\* \* \* \* \*